(12) United States Patent
Chinnakkonda Vidyapoornachary et al.

(10) Patent No.: US 9,996,411 B1
(45) Date of Patent: Jun. 12, 2018

(54) IN-CHANNEL MEMORY MIRRORING

(71) Applicant: International Business Machines Corporation, Armonk, NY (US)

(72) Inventors: Diyanesh B. Chinnakkonda Vidyapoornachary, Bangalore (IN); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/362,912

(22) Filed: Nov. 29, 2016

(51) Int. Cl.
*G06F 11/14* (2006.01)
*G06F 11/07* (2006.01)
*G11C 11/4096* (2006.01)

(52) U.S. Cl.
CPC ........ *G06F 11/0793* (2013.01); *G06F 11/073* (2013.01); *G06F 11/14* (2013.01); *G11C 11/4096* (2013.01)

(58) Field of Classification Search
CPC ...................................................... G06F 11/14
USPC .......................................................... 711/162
See application file for complete search history.

(56) References Cited

U.S. PATENT DOCUMENTS

| | | | |
|---|---|---|---|
| 7,246,257 B2* | 7/2007 | Lai | G06F 11/1666 714/6.2 |
| 7,287,138 B2 | 10/2007 | Bland et al. | |
| 8,250,330 B2* | 8/2012 | Lais | G06F 12/0653 365/230.05 |
| 8,689,041 B2* | 4/2014 | Lu | G06F 11/1666 714/6.13 |
| 9,262,284 B2* | 2/2016 | Atherton | G06F 11/1666 |
| 9,436,563 B2* | 9/2016 | Chinnakkonda Vidyapoornachary | G11C 14/009 |
| 9,501,432 B2* | 11/2016 | Cordero | G06F 13/1673 |
| 2008/0140961 A1 | 6/2008 | Atherton et al. | |
| 2012/0124415 A1 | 5/2012 | Borkenhagen et al. | |

OTHER PUBLICATIONS

Gravyface, "Mirrored Mode RAM: Is it worth it?", Serverfault.com, Stack Exchange, asked Mar. 4, 2011 at 19:11, Accessed on Mar. 3, 2016 9:45AM, 5 pages, <http://serverfault.com/questions/243373/mirrored-mode-ram-is-it-worth-it>.

(Continued)

*Primary Examiner* — Son Mai
(74) *Attorney, Agent, or Firm* — Brian M. Restauro

(57) ABSTRACT

Embodiments of the present invention provide methods, program products, and systems for improving DIMM level memory mirroring. Embodiments of the present invention can be used to configure a first memory module device of a pair memory module devices to receive a set of read and write operations and configure a second memory module device of the pair of memory module devices to receive only write operations of the set of read and write operations. Embodiments of the present invention can, responsive to detecting a failure, reconfiguring the first and the second memory module device to set the first memory module device to receive only write operations of the set of read and write operations and the second memory module device to receive read and write operations of the set of read and write operations.

17 Claims, 5 Drawing Sheets

(56) References Cited

OTHER PUBLICATIONS

Shankland, Stephen, "Google: Computer memory flakier than expected", CNET, Oct. 7, 2009, 2:38 PM PDT, Accessed Mar. 3, 2016 9:58AM, 6 pages, <http://www.cnet.com/news/google-computer-memory-flakier-than-expected/>.
"Memory Mirroring", IBM System x3550 M3, Type 4254 and 7944, Installation and User's Guide, Twelfth Edition, Jun. 2014, © Copyright IBM Corporation 2014, p. 58-59, <http://publib.boulder.ibm.com/infocenter/systemx/documentation/index.jsp?topic=/com.ibm.sysx.7944.doc/c_memory_mirroring.html>.

\* cited by examiner

IN-CHANNEL MEMORY MIRRORING

BACKGROUND

The present invention relates generally to the field of memory modules, and more particularly to memory module devices.

Computer memory generally refers to any physical device that is capable of storing information temporarily or permanently. Typically, memory can either be volatile (i.e., loses its content when the device loses power) or non-volatile (i.e., retains its contents even if power is lost). Examples of volatile memory include memory module devices such as Single In-Line Memory Modules (SIMM) and Dual In-Line Memory Modules (DIMM). In cases of unexpected power loss, data residing in either volatile memory module device are lost and cannot be recovered. In DIMM level memory mirroring, data from one DIMM is mirrored to another DIMM to provide data redundancy. IF any one DIMM fails with unrecoverable error, system operations can continue using the other DIMM.

SUMMARY

In one embodiment of the present invention, a computer-implemented method is providing comprising: configuring a first memory module device of a pair memory module devices to receive a set of read and write operations; configuring a second memory module device of the pair of memory module devices to receive only write operations of the set of read and write operations; and responsive to detecting a failure, reconfiguring the first and the second memory module device to set the first memory module device to receive only write operations of the set of read and write operations and the second memory module device to receive read and write operations of the set of read and write operations.

DETAILED DESCRIPTION

Embodiments of the present invention recognize that failed DIMMs (Dual-Inline Memory Modules) can cause service disruptions in customer environments. In some instances, failed DIMMs can be replaced at the cost of service disruption. In other instances, a dual drop DIMM configuration (e.g., where mirroring a first DIMM to a second DIMM) can consume two times the write bandwidth as write data is sent to both mirrored and mirroring copies). Embodiments of the present invention provide solutions to improve the reliability, availability, and service of DIMM level memory mirroring. In this manner, as discussed in greater detail later in this specification, embodiments of the present invention can improve DIMM level memory mirroring by configuring a pass-thru mode (e.g., allowing all bus transaction) on a first DIMM and a configuring a second DIMM to a mirror mode (e.g., where it allows only writes to DRAMS). In the event of the first DIMM experiencing a failure, embodiments of the present invention can enable memory mirroring on the same channel and reconfigure the second DIMM to the pass-thru mode to allow all bus transactions which allows users to resume operations with minimal or no down time.

Figure 1:
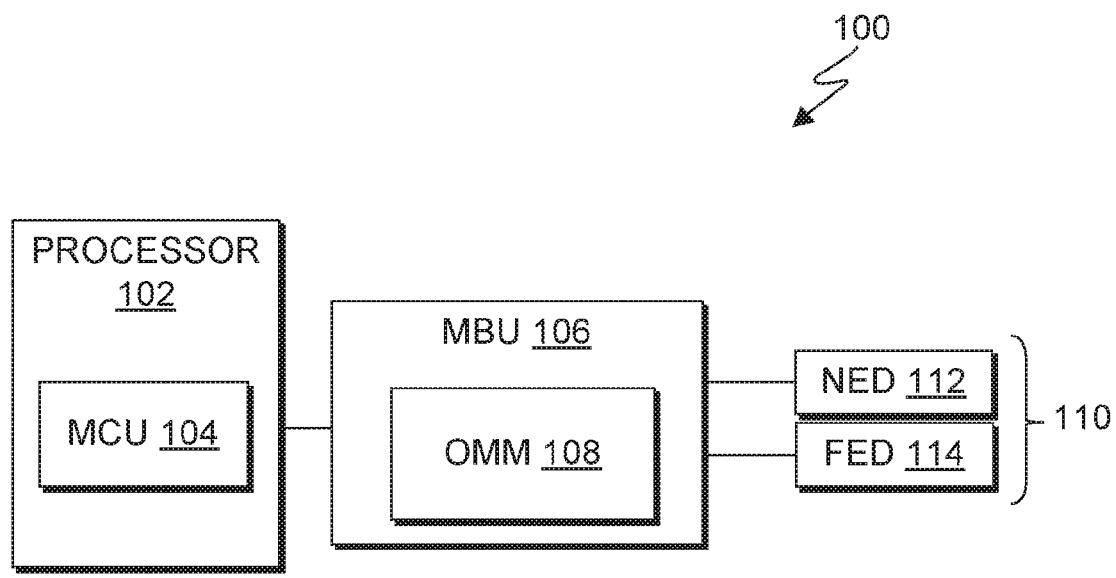
FIG. 1 is a block diagram of a computing environment, in accordance with an embodiment of the present invention.

FIG. 1 is a functional block diagram of computing environment 100, in accordance with an embodiment of the present invention. Computing environment 100 includes processor 102. Processor 102 can be a desktop computer, laptop computer, specialized computer servers, or any other computer system known in the art. In certain embodiments, processor 102 represents computer systems utilizing clustered computers and components to act as a single pool of seamless resources when accessed through a network. For example, such embodiments may be used in data center, cloud computing, storage area network (SAN), and network attached storage (NAS) applications. In certain embodiments, processor 102 represents a virtual machine. In general, processor 102 is representative of any electronic device, or combination of electronic devices, capable of executing machine-readable program instructions, as described in greater detail with regard to FIG. 4.

Processor 102 includes memory controller unit 104 (MCU 104). MCU 104 facilitates the flow of data going to and from memory associated with processor 102 (e.g., memory module device pair 110). For example, MCU 104 can configure a pair of memory module devices (e.g., a pair of DIMMs) to have two modes so as to allow users to resume operations with minimal or no down time in the event of a failure, as discussed in greater detail later with regard to FIGS. 2 and 3. A "failure" as used herein, can be any abnormal termination, interruption, or error in software and/or hardware in processor 102 that affects access to processor 102 or another component of computing environment 100. For example, a failure can be an unrecoverable error, that is, an error that occurs during a computer's (e.g., processor 102) operation of a code or program that has not been registered before and no amount retries can correct or undo the error.

In this embodiment, MCU 104 can configure memory module devices to function in a pass thru or mirror mode. A "pass thru mode" as used herein, refers to a mode wherein a memory module device (e.g., a first DIMM of a pair of DIMMs) is configured to allow all bus transactions, for example, read and write operations. A "mirror mode" as used herein, refers to a mode wherein a memory module device (e.g., a second DIMM of a pair of DIMMs) is configured to allow only write operations to Dynamic Random Access Memory (DRAMs).

In this embodiment, responsive to detecting a failure, MCU 104 can reconfigure the pair of DIMMs so as to allow users to resume operations with minimal or no down time by enabling in-channel memory mirroring. A "failure" as used herein, refers generally to any abnormal termination, interruption, or error in software and/or hardware in the processor another component of the computing environment that affects processor 102 (e.g., loss of power via a drop in voltage). For example, the first DIMM of a pair of DIMMs configured to function in the pass thru mode while the second DIMM can be configured to function in the mirror mode. Responsive to detecting that a failure occurred on the first DIMM, MCU 104 can reconfigure the second DIMM to receive read and write operations. In other words, MCU 104 can reconfigure the second DIMM to function in the pass thru mode. MCU 104 can then reconfigure the first DIMM to function in mirror mode. Accordingly, operations can resume with little or no down time.

In this embodiment, MCU 104 is connected to memory buffering unit 106 (MBU 106). MCU 104 can leverage MBU 106 to temporarily store data from an input device (e.g., processor 102) to an output device (e.g., memory module device pair). MBU 106 is also capable of performing various memory controller operations as well (e.g., schedule memory operations based on requests received from MCU 104 such as read re-order, write command re-order, etc.). MBU 106 includes on-demand memory mirroring unit 108 (OMM 108). OMM 108 interacts with memory module device pair 110 performs on demand memory mirroring to DIMMs of memory module device pair 110. OMM 108 controls and can recognize operational modes associated with memory module devices (e.g., pass thru and mirror modes). OMM 108 also controls DRAM MRS register configurations.

Memory module device pair 110 are a pair of memory module devices. A "memory module device" as used herein, refers generally to a hardware storage device having one or more memory modules. For example, a memory module device can be Single In-Line Memory Module (SIMM), a Dual In-Line Memory Module (DIMM), and/or other types of hardware storage devices having one or more memory modules, as will be appreciated by those of ordinary skill in the art.

In this embodiment, memory module device pair 110 are a pair of DIMMs that include a first and second DIMM. Specifically, memory module device pair 110 includes near end DIMM (e.g., NED 112) and far end DIMM (e.g., FED 114). In this embodiment, NED 112 and FED 114 are depicted as having non-shared, independent connections to MBU 106. In other embodiments, NED 112 and FED 114 can have a bifurcated connection. In yet other embodiments, NED 112 and FED 114 can be connected in series.

It should be understood that, for illustrative purposes, FIG. 1 does not show other computer systems and elements which may be present when implementing embodiments of the present invention. For example, while FIG. 1 shows a single processor (e.g., processor 102), a single MCU (e.g., MCU 104), and a pair of DIMMs (e.g., memory module device pair 110). However, computing environment can include multiple processors, MCUs, and DIMM pairs.

Figure 2:
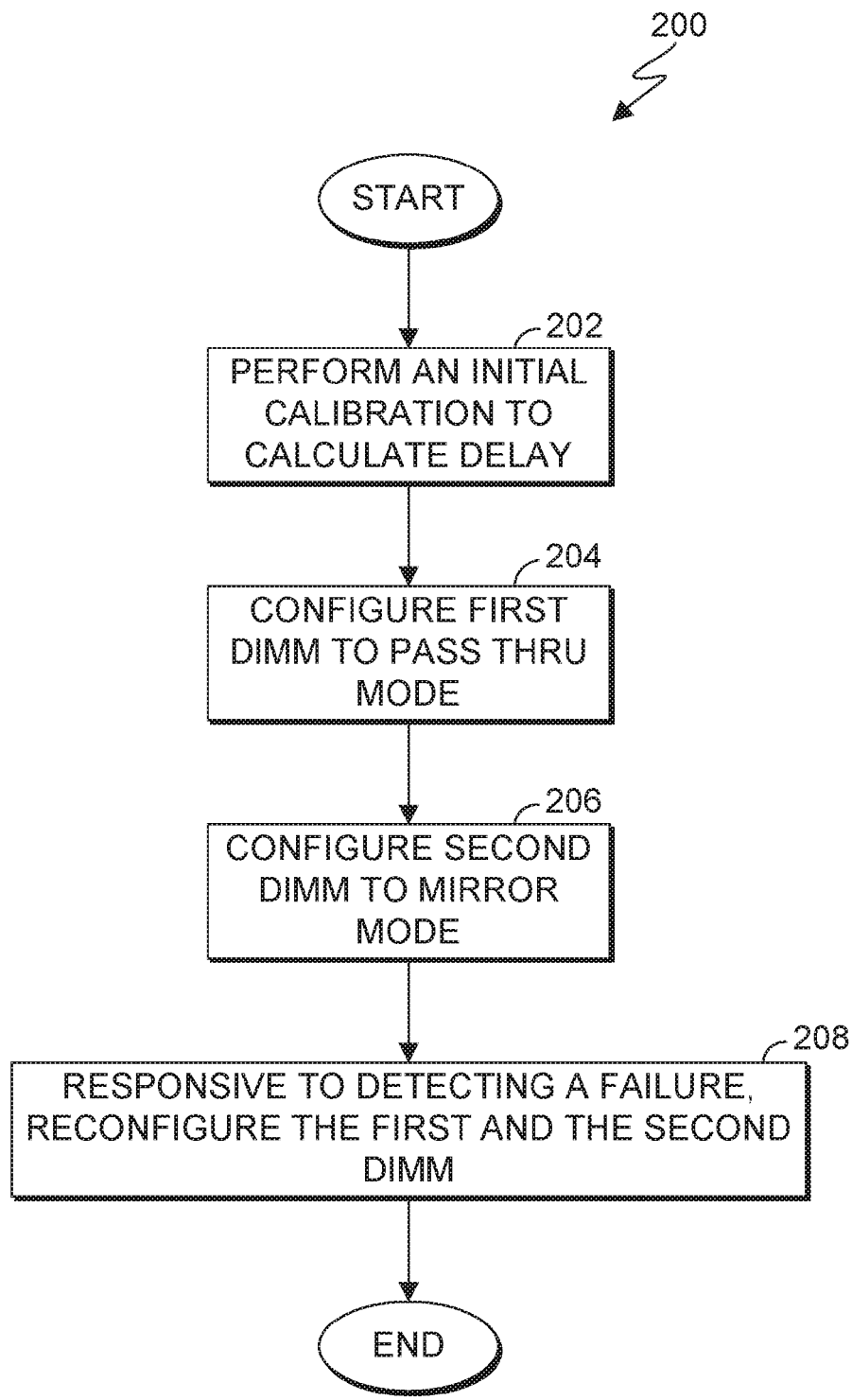
FIG. 2 is a flowchart illustrating operational steps for improving DIMM level memory mirroring, in accordance with an embodiment of the present invention.

FIG. 2 is a flowchart 200 illustrating operational steps for improving DIMM level memory mirroring, in accordance with an embodiment of the present invention.

In step 202, MCU 104 transmits an instruction to MBU 106 to perform an initial calibration to calculate delay. In this embodiment, MCU 104 transmits an instruction to MBU 106 to perform an initial calibration to calculate delay when the system is initially powered on. MBU 106 calculates the exact delay required to perform a read and write operation to a particular memory module device (e.g., NED 112 and FED 114). For example, MBU 106 calculates the exact delay to find out the board trace length, memory buffer IO delay, and traditional memory used to write data on the memory module devices. The calibration is needed to establish memory controller and gate settings to ensure proper write and read operations to and from DRAM memory. In other words, MBU 106 can perform an initial calibration to calculate and vary delays iteratively until a point where maximum read and write timing margins are ensured at byte lane granularity to account for length variation among byte lanes. MBU 106 can then store the calculated delay for future transactions. MBU 106 can then update the calculated delay based on process/voltage and temperature variations.

In step 204, MCU 104 configures the first DIMM (e.g., NED 112) to pass thru mode. In this embodiment, MCU 104 configures the first DIMM to pass thru mode by transmitting instructions to the first DIMM via OMM 108 to allow only write operations and to share address line space between the first and second DIMM. In other words, only write operations are performed on the second DIMM.

In step 206, MCU 104 configures the second DIMM (e.g., FED 114) to mirror mode. In this embodiment, MCU 104 configures the second DIMM by transmitting instructions to the first DIMM via OMM 108 to allow write operations on FED 114. Accordingly, OMM 108 can mirror data of the first DIMM to the second DIMM using the shared address space between the first and the second DIMM. For example, OMM 108 can get 128 byte cache line from the first DIMM (e.g., NED 112) and mirror it to the second DIMM (e.g., FED. 112).

In step 208, MCU 104 reconfigures the first and the second DIMM responsive to detecting a failure. In this embodiment, MCU 104 reconfigures the first and the second DIMM by sharing signals (e.g., via a set of multiplexers initiated by OMM 108 in response to receiving instructions from MCU 104) to achieve chip selection (i.e., selecting different memory module devices) to both the DIMMS (e.g., NED 112 and FED 114), and other signals such as on-die termination (ODT), clock enable (CKE), address lines, etc. to both DIMMs, as discussed in greater detail with regard to FIG. 3. Accordingly writes are allowed to both the DIMMs.

Figure 3:
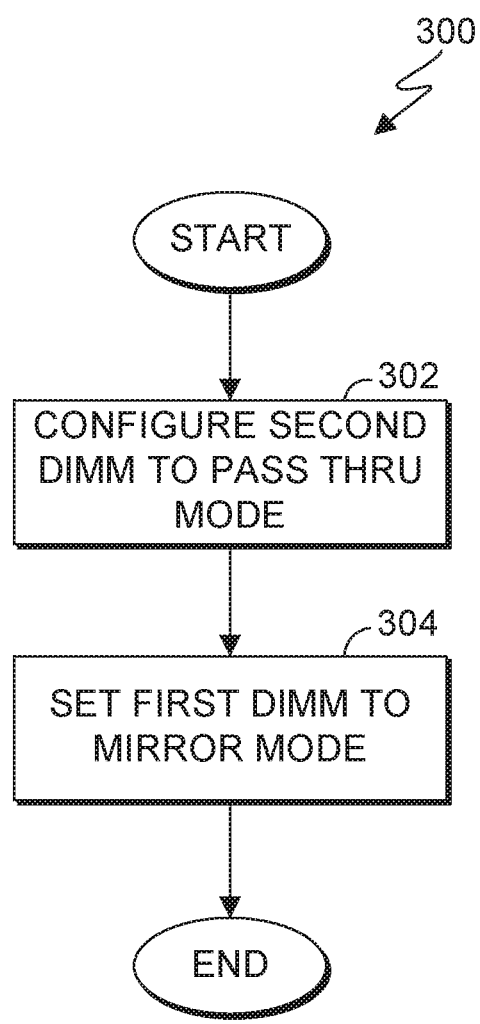
FIG. 3 is a flowchart illustrating operational steps for reconfiguring a pair of DIMMS, in accordance with an embodiment of the present invention.

FIG. 3 is a flowchart 300 illustrating operational steps for reconfiguring a pair of DIMMS, in accordance with an embodiment of the present invention.

In step 302, MCU 104 configures the second DIMM to function in pass thru mode. In this embodiment, MCU 104 configures the second DIMM to function in pass thru mode by sharing signals such as CS to both DIMMs. For example, MCU 104 can transmit an instruction to switch the CS line to behave in the pass thru mode. As mentioned before a "pass thru mode" as used herein, refers to a mode wherein a memory module device (e.g., a first DIMM of a pair of DIMMs) is configured to allow all bus transactions, for example, read and write operations.

In step 304, MCU 104 configures the first DIMM to function in mirror mode. In this embodiment, MCU 104 configures the second DIMM to function in pass thru mode by transmitting instructions to OMM 108 to share signals such as CS to both DIMMs (e.g., CS0, and CS1). For example, MCU 104 can transmit an instruction to switch the CS line to behave the way when mirror is enabled. Accordingly, the CS0 and 1 will transmit operations to FED 114 and CS2 will transmit operations to NED 112. As mentioned before, a "mirror mode" as used herein, refers to a mode wherein a memory module device (e.g., a second DIMM of a pair of DIMMs) is configured to allow only write operations to Dynamic Random Access Memory (DRAMs).

Accordingly, new read and write operations can be performed on the second DIMM while write operations can be performed on the first DIMM. For example, MCU 104 can continue to perform write operations to the first DIMM to mirror the write operations performed on the second DIMM. In this embodiment, MCU 104 can continue to perform write operations to the first DIMM by identifying a specific location associated with the point of failure and resume write operations from the point of failure.

Figure 4:
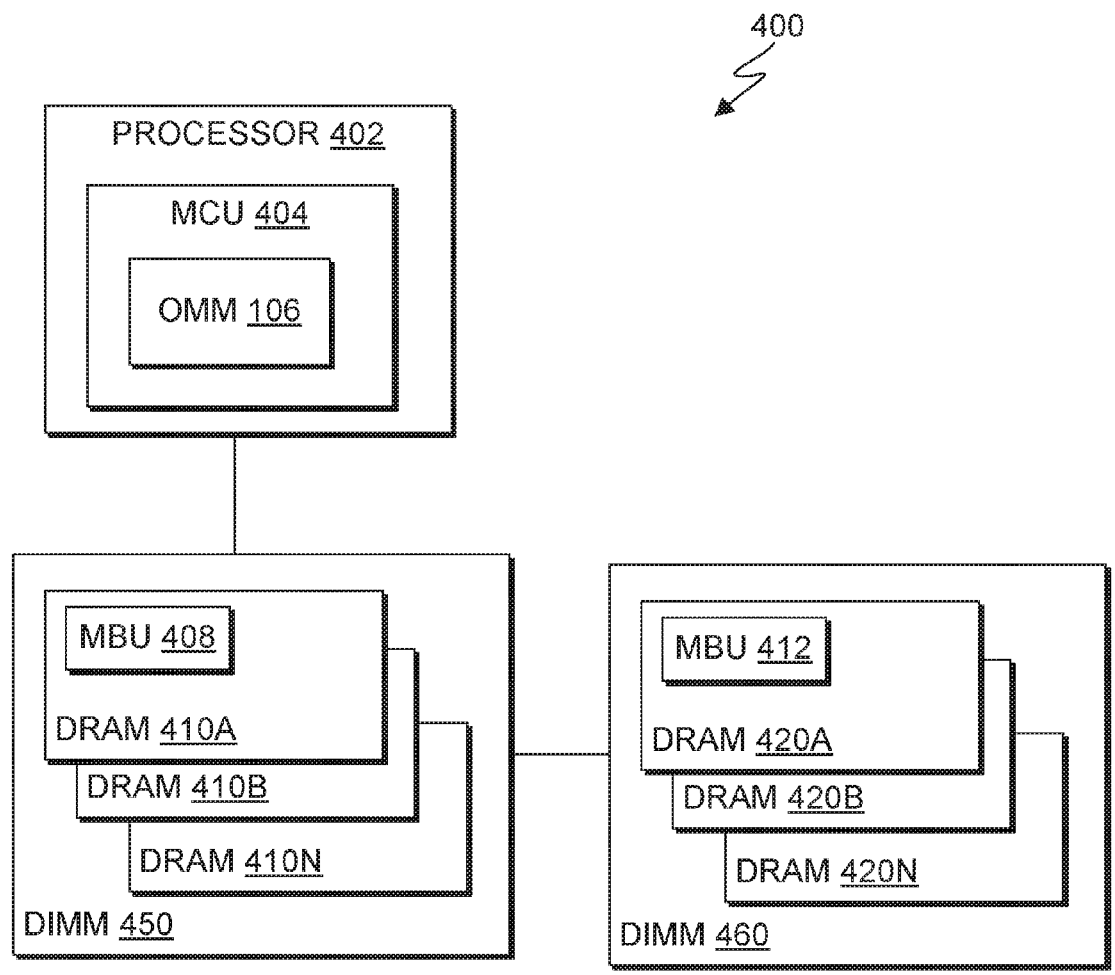
FIG. 4 is an example diagram that is helpful in understanding hardware set up that enables memory mirroring, in accordance with an embodiment of the present invention.

FIG. 4 is an example diagram 400 that is helpful in understanding hardware set up that enables memory mirroring, in accordance with an embodiment of the present invention.

In this example, diagram 400 represents a computing environment presents an alternate configuration of components described in FIG. 1. For example, processor 402, memory controller unit (MCU) MCU 404, on-demand memory mirroring unit (OMM) OMM 108 and memory buffering unit (MBU) MBU 408, and MBU 412 are counterparts to processor 102, MCU 104, OMM 108 and MBU 106.

Diagram 400 also includes a pair of DIMM 450 and DIMM 460. In this example, DIMM 450 serves as the DIMM that is configured in a "pass thru mode". As mentioned before a "pass thru mode" as used herein, refers to a mode wherein a memory module device (e.g., a first DIMM of a pair of DIMMs) is configured to allow all bus transactions, for example, read and write operations. DIMM 460 serves as the DIMM configured in a "mirror mode" which refers to a mode wherein a memory module device (e.g., a second DIMM of a pair of DIMMs) is configured to allow only write operations to Dynamic Random Access Memory (DRAMs). Each of DIMM 450 and DIMM 460 includes a respective MBU unit (e.g., MBU 408 and MBU 408') and respective DRAM units (e.g., DRAM 410A-N of DIMM 450 and DRAM 420A-N of DIMM 460.

In this example, MCU 404 has detected a failure with DIMM 450. MCU 404 has transmitted a command to OMM 406 to initiate the reconfiguration process and OMM 406 has reconfigured DIMM 460 to a pass thru mode and DIMM 450 to a mirror mode via an inline bus. Accordingly, new read and write operations can be performed on DIMM 460 while "write operations" can be performed from the point of failure identified by MCU 404. MCU 404 can then continue to perform updated write operations on to respective DRAMS of DIMM 450 to mirror the writes performed on DIMM 460.

Embodiments of the present invention recognize problems with dual drop configuration which consume two times write bandwidth as write data needs to be sent to both mirrored and mirroring copies. However, embodiments of the present invention provide solutions to minimize the write bandwidth by providing memory buffering units inside the DRAM with an ability to register, regenerate, and filter specific transactions to support mirror of data in another DRAM which is achieved with the help of the in line bus between memory buffering units of DRAMS which preserves memory bandwidth and read transactions from the mirrored DRAM. Embodiments of the present invention further provide capabilities to configure DRAMs in either pass thru or mirror mode using mode, register, set (MRS) commands from a memory controller unit. Specifically, embodiments of the present invention further provide capabilities to switch between pass thru or mirror modes in response to detecting a failure.

Figure 5:
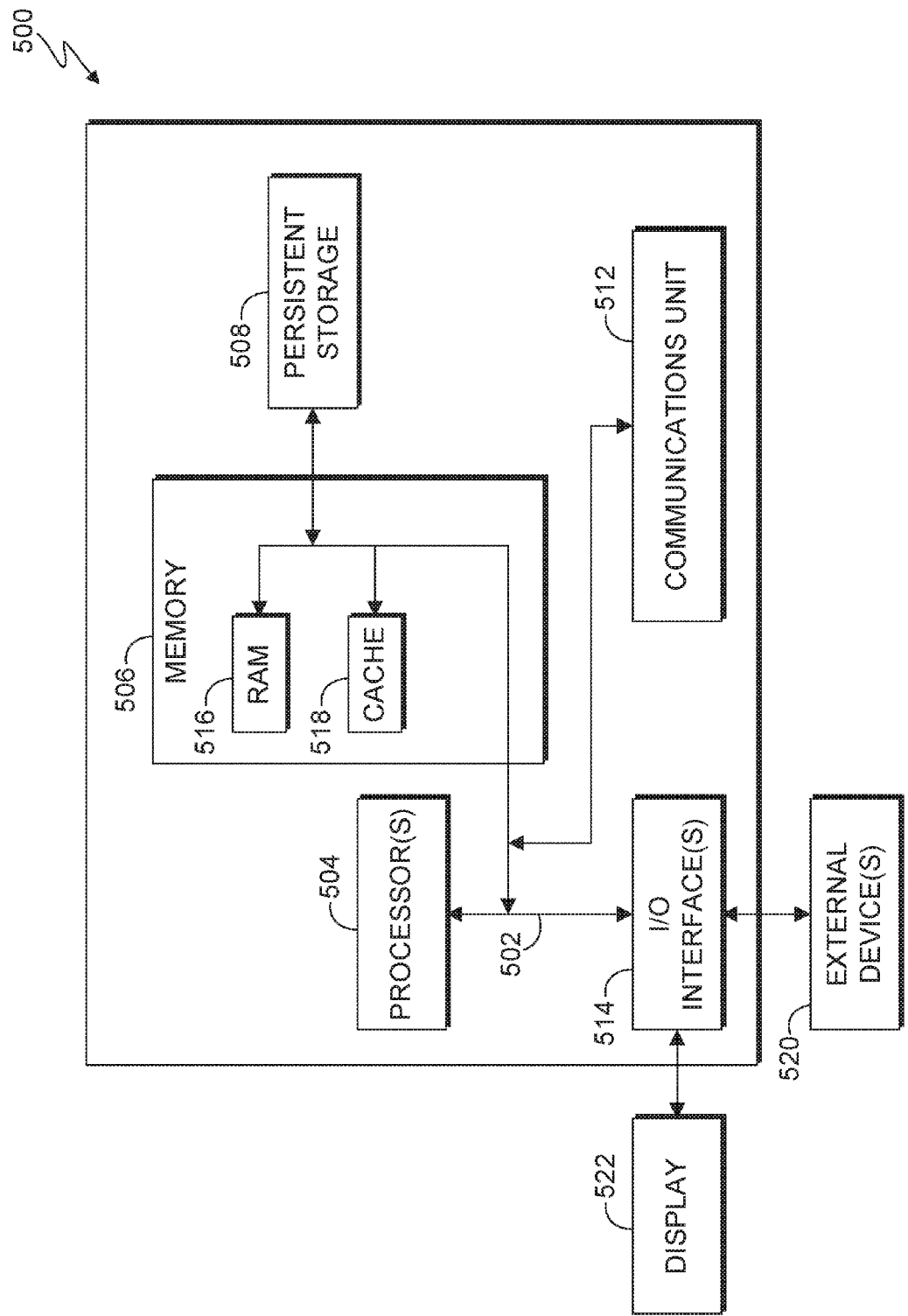
FIG. 5 is a block diagram of internal and external components of the computer systems of FIG. 1, in accordance with an embodiment of the present invention.

FIG. 5 is a block diagram of internal and external components of a computer system 500, which is representative the computer systems of FIG. 1, in accordance with an embodiment of the present invention. It should be appreciated that FIG. 5 provides only an illustration of one implementation and does not imply any limitations with regard to the environments in which different embodiments may be implemented. In general, the components illustrated in FIG. 5 are representative of any electronic device capable of executing machine-readable program instructions. Examples of computer systems, environments, and/or configurations that may be represented by the components illustrated in FIG. 5 include, but are not limited to, personal computer systems, server computer systems, thin clients, thick clients, laptop computer systems, tablet computer systems, cellular telephones (e.g., smart phones), multiprocessor systems, microprocessor-based systems, network PCs, minicomputer systems, mainframe computer systems, and distributed cloud computing environments that include any of the above systems or devices.

Computer system 500 includes communications fabric 502, which provides for communications between one or more processors 504, memory 506, persistent storage 508, communications unit 512, and one or more input/output (I/O) interfaces 514. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 516 and cache memory 518. In general, memory 506 can include any suitable volatile or non-volatile computer-readable storage media. Software is stored in persistent storage 508 for execution and/or access by one or more of the respective processors 504 via one or more memories of memory 506.

Persistent storage 508 may include, for example, a plurality of magnetic hard disk drives. Alternatively, or in addition to magnetic hard disk drives, persistent storage 508 can include one or more solid state hard drives, semiconductor storage devices, read-only memories (ROM), erasable programmable read-only memories (EPROM), flash memories, or any other computer-readable storage media that is capable of storing program instructions or digital information.

The media used by persistent storage 508 can also be removable. For example, a removable hard drive can be used for persistent storage 508. Other examples include optical and magnetic disks, thumb drives, and smart cards that are inserted into a drive for transfer onto another computer-readable storage medium that is also part of persistent storage 508.

Communications unit 512 provides for communications with other computer systems or devices via a network. In this exemplary embodiment, communications unit 512 includes network adapters or interfaces such as a TCP/IP adapter cards, wireless Wi-Fi interface cards, or 3G or 4G wireless interface cards or other wired or wireless communication links. The network can comprise, for example, copper wires, optical fibers, wireless transmission, routers, firewalls, switches, gateway computers and/or edge servers. Software and data used to practice embodiments of the present invention can be downloaded through communications unit 512 (e.g., via the Internet, a local area network or other wide area network). From communications unit 512, the software and data can be loaded onto persistent storage 508.

One or more I/O interfaces 514 allow for input and output of data with other devices that may be connected to computer system 500. For example, I/O interface 514 can provide a connection to one or more external devices 520 such as a keyboard, computer mouse, touch screen, virtual keyboard, touch pad, pointing device, or other human interface devices. External devices 520 can also include portable computer-readable storage media such as, for example, thumb drives, portable optical or magnetic disks, and memory cards. I/O interface 514 also connects to display 522.

Display 522 provides a mechanism to display data to a user and can be, for example, a computer monitor. Display 522 can also be an incorporated display and may function as a touch screen, such as a built-in display of a tablet computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
    configuring a first memory module device of a pair memory module devices to receive a set of read and write operations;
    configuring a second memory module device of the pair of memory module devices to receive only write operations of the set of read and write operations; and
    responsive to detecting a failure, reconfiguring the first and the second memory module device to set the first memory module device to receive only write operations of the set of read and write operations and the second memory module device to receive read and write operations of the set of read and write operations, wherein reconfiguring the first and the second memory module devices comprises:
        transmitting a set of instructions to an on demand memory mirroring unit to share address space between the first and the second memory module device.

2. The computer-implemented method of claim 1, further comprising:
    identifying a failed location of the first memory module device;
    reading data of the first memory module device at the identified failed location of the first memory module device; and
    performing read and write operations on the second memory module device from the identified failed location of the first memory module device.

3. The computer implemented method of claim 2, further comprising:
    updating the first memory module device with data written to the second memory module device.

4. The computer-implemented method of claim 1, wherein the first and the second memory module device are Dual In-Line Memory Modules.

5. The computer implemented method of claim 1, wherein the set of instructions to share address space between the first and the second memory module device comprises: on-die termination (ODT), clock enable (CKE), and address lines.

6. The computer-implemented method of claim 1, wherein detecting a failure comprises:
    identifying a loss of power to the first and the second memory module devices.

7. A computer program product comprising:
    one or more computer readable storage media and program instructions stored on the one or more computer readable storage media, the program instructions comprising:
        program instructions to configure a first memory module device of a pair memory module devices to receive a set of read and write operations;
        program instructions to configure a second memory module device of the pair of memory module devices to receive only write operations of the set of read and write operations; and
        program instructions to, responsive to detecting a failure, reconfigure the first and the second memory module device to set the first memory module device to receive only write operations of the set of read and write operations and the second memory module device to receive read and write operations of the set of read and write operations, wherein the program instructions to reconfigure the first and the second memory module devices comprise:
            program instructions to transmit a set of instructions to an on demand memory mirroring unit to share address space between the first and the second memory module device.

8. The computer program product of claim 7, wherein the program instructions stored on the one or more computer readable storage media further comprise:
    program instructions to identify a failed location of the first memory module device;
    program instructions to reading data of the first memory module device at the identified failed location of the first memory module device; and
    program instructions to perform read and write operations on the second memory module device from the identified failed location of the first memory module device.

9. The computer program product of claim 8, wherein the program instructions stored on the one or more computer readable storage media further comprise:
    program instructions to update the first memory module device with data written to the second memory module device.

10. The computer program product of claim 7, wherein the first and the second memory module device are Dual In-Line Memory Modules.

11. The computer program product of claim 7, wherein the set of instructions to share address space between the first and the second memory module device comprises: on-die termination (ODT), clock enable (CKE), and address lines.

12. The computer program product of claim 7, wherein the program instructions to detect a failure comprise:
    program instructions to identify a loss of power to the first and the second memory module devices.

13. A computer system comprising:
    one or more computer processors;
    one or more computer readable storage media; and
    program instructions stored on the one or more computer readable storage media for execution by at least one of the one or more computer processors, the program instructions comprising:
        program instructions to configure a first memory module device of a pair memory module devices to receive a set of read and write operations;
        program instructions to configure a second memory module device of the pair of memory module devices to receive only write operations of the set of read and write operations; and
        program instructions to, responsive to detecting a failure, reconfigure the first and the second memory module device to set the first memory module device to receive only write operations of the set of read and write operations and the second memory module device to receive read and write operations of the set of read and write operations, wherein the program instructions to reconfigure the first and the second memory module devices comprise:

program instructions to transmit a set of instructions to an on demand memory mirroring unit to share address space between the first and the second memory module device.

14. The computer system of claim 13, wherein the program instructions stored on the one or more computer readable storage media further comprise:

program instructions to identify a failed location of the first memory module device;

program instructions to reading data of the first memory module device at the identified failed location of the first memory module device; and program instructions to perform read and write operations on the second memory module device from the identified failed location of the first memory module device.

15. The computer system of claim 14, wherein the program instructions stored on the one or more computer readable storage media further comprise:

program instructions to update the first memory module device with data written to the second memory module device.

16. The computer system of claim 13, wherein the first and the second memory module device are Dual In-Line Memory Modules.

17. The computer system of claim 13, wherein the set of instructions to share address space between the first and the second memory module device comprises: on-die termination (ODT), clock enable (CKE), and address lines.

* * * * *